United States Patent [19]

Rybny et al.

[11] 4,130,518
[45] Dec. 19, 1978

[54] PREPARATION OF ACRYLATED OR METHACRYLATED POLYMERS UTILIZING A PARTIALLY SOLUBILIZED HYDROCARBON FRACTION AS THE AZEOTROPING MEDIUM

[75] Inventors: Charles B. Rybny, Franklin Township, Sussex County; Eli Levine, Union, both of N.J.

[73] Assignee: Celanese Corporation, New York, N.Y.

[21] Appl. No.: 853,611

[22] Filed: Nov. 21, 1977

Related U.S. Application Data

[62] Division of Ser. No. 744,491, Nov. 24, 1976.

[51] Int. Cl.² .................... C08L 91/00; C08G 63/12
[52] U.S. Cl. ........................ 260/22 CB; 204/159.15; 204/159.19; 260/18 R; 260/823; 260/33.6 UA
[58] Field of Search ........... 260/22 CB, 18 R, 75 UA, 260/33.6 UA, 47 UA, 864, 861

[56] References Cited

U.S. PATENT DOCUMENTS

| 3,719,728 | 3/1973 | Mirnada ................................. 260/861 |
| 3,878,076 | 4/1975 | Nishikubo et al. .............. 204/159.15 |
| 3,933,746 | 1/1976 | Steele ................................. 260/47 C |
| 3,933,939 | 1/1976 | Isozaki et al. ........................ 260/872 |

Primary Examiner—Lucille M. Phynes
Attorney, Agent, or Firm—Kenneth A. Genoni

[57] ABSTRACT

There is disclosed a process for conveniently preparing polymers having pendant ultraviolet polymerizable groups which involves co-reacting a polymer containing the C-X moiety with a monomer having the general formula

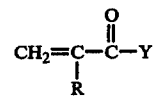

wherein X is OH or COOH and Y is OH when X is OH, and OR'OH when X is COOH, wherein R is hydrogen or methyl and R' is $C_1$-$C_6$ alkyl. This process is carried out utilizing a partially solubilized hydrocarbon fraction as the azeotroping medium.

9 Claims, No Drawings

PREPARATION OF ACRYLATED OR METHACRYLATED POLYMERS UTILIZING A PARTIALLY SOLUBILIZED HYDROCARBON FRACTION AS THE AZEOTROPING MEDIUM

This is a divisional of application Ser. No. 774,491, filed Nov. 24, 1976.

BACKGROUND OF INVENTION

This invention pertains to ultraviolet curable coatings compositions. More particularly, this invention pertains to processes for rendering normally-inert polymers curable by the use of ultraviolet radiation.

The use of ultraviolet curable coating compositions has steadily increased in recent years due to desires for conservation of energy and for reduction of polluting effluents. Ultraviolet curable coating compositions are useful in both these areas, because they (1) require little energy for curing, and (2) do not in most cases produce pollutants when cured.

Heretofore, however, most ultraviolet curable compositions have been based upon essentially monomeric materials. The incorporation of acrylate unsaturation onto polymeric backbones by direct esterification between, for example, acrylic acid and an hydroxy-containing polymer, has been difficult due to the extremely high reaction temperature required to effect the direct esterification reaction. Furthermore, direct esterification reactions using either no catalyst or traditional esterification catalysts, have required extended periods of time for complete esterification. Both high reaction temperatures and extended esterification times have contributed greatly to low product yield, due in large part to polymerization which occurs during these high temperature, long-term direct esterification processes.

One method of reducing the reaction temperature is by the use of an azeotroping solvent. Most common solvents for such use include benzene, which is too toxic, and toluene and xylene, both of which have reflux temperatures which are higher than is desirable. Furthermore, benzene, toluene, and xylene exhibit in most cases total solubility with a finished product and thus require vacuum to obtain essentially solvent-free compositions.

Thus, it is an object of this invention to prepare polymeric materials which have pendant groups, such as acrylate groups, which are subject to ultraviolet curing.

It is another object of this invention to prepare highly acrylated polymeric coatings.

It is a further object of this invention to prepare acrylated coating compositions by a process utilizing an azeotroping solvent which allows reaction at significantly reduced temperatures and which solvent is easily removable after the reaction is completed.

These and other objectives are obtained by carrying out the instant invention.

SUMMARY OF INVENTION

Basically, this invention involves a co-reaction between a polymer having pendant groups of the formula

with a monomeric material having a formula

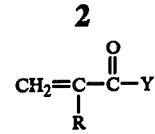

wherein X is OH or COOH, and Y is OH when X is OH, or OR'OH when X is COOH, wherein R is hydrogen or methyl, and R' is $C_1$-$C_6$ alkyl, using a partially solubilized hydrocarbon fraction as an azeotroping solvent.

DESCRIPTION OF INVENTION

The polymers which are useful in the instant invention are of two types — pendant aliphatic hydroxy-containing, and pendant carboxy-containing. In either event, the polymers should have a number average molecular weight of less than about 10,000, preferably about 300 to about 5,000. Furthermore, the polymers should contain at least about two carboxy or hydroxy groups, or mixtures thereof, per molecule, preferably about three or four carboxy or hydroxy groups per molecule. It is, in addition, preferred that the hydroxy groups be primary or secondary in nature, although tertiary hydroxy groups may also be employed.

Examples of the types of polymers which may furnish such aliphatic hydroxyl groups include polymers prepared from alpha beta ethylenically unsaturated monomers containing an alpha beta ethylenically unsaturated, aliphatic, hydroxycontaining monomer, with the remainder of the polymer being formed of vinyl monomers copolymerizable therewith. Examples of the monomers include allyl and methallyl alcohol, hydroxy alkyl esters of polymerizable acids, including the beta hydroxy alkyl esters of acrylic acid, methacrylic acid, crotonic acid, itaconic acid, and the like. The preferred hydroxy alkyl esters are those which contain 2 to 4 carbon atoms in the alkyl group. Examples of these esters are beta hydroxy ethyl acrylate, beta hydroxy ethyl methacrylate, beta hydroxy propylacrylate, beta hydroxy propyl methacrylate, beta hydroxy butyl crotonate, beta hydroxy propyl maleate, beta hydroxy ethyl fumarate, and the like. Beta hydroxy alkyl esters can generally be prepared by reacting a monoepoxide-containing compound with a polymerizable, alpha beta ethylenically unsaturated acid. Examples of such monoepoxides are ethylene oxide, 1,2-propylene oxide, 1,2-butylene oxide, 2,3-butylene oxide, styrene oxide, phenyl glycidyl ether, butyl glycidyl ether, and the like. Most preferred of the hydroxy-containing monomers are beta hydroxy ethyl acrylate and beta hydroxy propyl acrylate.

In addition to the hydroxy monomer, other types of ethylenically unsaturated monomers which are copolymerizable therewith may be employed. Examples of these monomers include styrene, vinyl toluene, vinyl acetate, vinyl propionate, vinyl butyrate, vinyl laurate, vinyl oleate, vinyl stearate, and the other vinyl esters of fatty acids having from 1 to 18 carbon atoms, as well as the polymerizable acids themselves.

Acrylonitrile, methacrylonitrile, acrylamide, methacrylamide, methylstyrene, allyl acetate, glycidyl methacrylate, t-butylaminoethylmethacrylate, vinyl pyrrolidone, N,N-dimethylaminoethylmethacrylate, ethylene, propylene, vinyl chloride, vinyl fluoride, vinylidene fluoride, hexafluoropropylene, chlorotrifluoroethylene, and tetrafluoroethylene can also be used as the monomers herein.

Generally, the hydroxy monomers should be added on a weight basis, so that they comprise about 10 to about 90 percent, by weight, of the monomers utilized, preferably about 30 to about 70 percent.

A preferred type of hydroxy-containing copolymer is prepared by copolymerizing styrene and allyl or methallyl alcohol in the range of about 70 to 95 percent, by weight, styrene, the remainder being allyl alcohol, or methallyl alcohol. Generally any of the varied methods of vinyl polymerization can be utilized in preparing the hydroxy-containing polymers of the instant invention. Preferably, the various polymerization initiators are utilized to effect polymerization. Examples of such initiators include organic peroxides, such as tertiary butyl hydroperoxide, ditertiary butyl peroxide, cumene hydroperoxide, dicumyl peroxide, benzoyl peroxide, and the like. Equally suitable are organic peroxygen compounds, such as tertiary butyl peroxide acetate, tertiary butyl perbenzoate, ditertiary butyl diperthalate and the like. Other initiators include azodiisobutyronitrile (AIBN), ultraviolet light, gamma radiation, etc.

The polymers of the instant invention may be prepared by a bulk polymerization process or by adding the above-described monomers to the reaction medium over a period ranging from 30 minutes to 10 to 12 hours. The polymerization initiator may be added to the reaction flask or may be mixed with the monomer, or separately added, depending upon the desired final product. Reaction temperatures may vary from 70 to 80° C. up to about 180 to 220° C. or higher, again depending upon the various desired end products and the monomers utilized.

The vinyl hydroxy polymers of the instant invention may be prepared in virtually any solvent in which the final polymer is soluble and which is not interferingly reactive with either the final product, the initiators or the monomers utilized. Examples of the solvents which may be utilized include, but are not limited to, the various alcohols, ester alcohols, ether alcohols, esters, and the like. In addition, minor amounts of petroleum-based solvents, such as mineral spirits, naphthas, and the like, may be utilized, as well as other solvents, such as xylene, toluene, benzene, and the like.

Where alcohol or ester-containing solvents are utilized, these solvents must be removed prior to the esterification reaction herein.

As previously described, carboxylic acid-containing monomers which have previously been set out, may be utilized either alone or in combination with the hydroxy-containing monomers previously set out. Where no hydroxy-containing monomer is employed, the carboxy-containing monomer should be utilized in an amount equal to about 10 to about 60 percent, by weight, based upon the total copolymer composition, preferably about 10 to about 30 percent. The carboxylic acid groups may be furnished by carboxylic acids, such as acrylic acid, methacrylic acid, crotonic acid, itaconic acid, and half-acid esters of maleic and fumaric acids, to name but a few.

Instead of utilizing the vinyl hydroxy-containing or carboxy-containing polymers described above-so-called alkyd resins may be utilized, as long as the previously set out requirements on the number of hydroxy or carboxy groups per molecule are met. Generally, in meeting these requirements, the alkyd resin will have an acid value in the range of about 2 to about 50, preferably about 6 to 15, or an hydroxy value of about 20 to about 250, preferably about 60 to about 150, or both.

The methods for preparing these resins are well known in the art. In general, two basic methods are used. In the first, a fatty acid is reacted with a mixture of polyols and polybasic acids, such as glycerine and phthalic anhydride. The second method commonly used entails the alcoholysis of a fatty oil, such as coconut oil, with a polyol, such as pentaerythritol, and the further condensation of this reaction production with polyols and polybasic acids as above.

The alkyd resins useful in this invention are those containing from about 5 to about 80 weight percent of a fatty acid or oil. Alkyd resins having less than about 5 per cent fatty compound are commonly classified as the "oil-less" alkyd resins or polyester resins and are described hereinafter.

Included among the various fatty acids and oils useful in preparing these alkyd resins are the fatty acids derived from the following oils: castor, dehydrated castor, hydrogenated castor, coconut, corn, cottonseed, linseed, oticica, perilla, poppyseed, safflower, soybean, tung oil, etc., and the various rosin-containing tall oil fatty acids. Useful polyols include the various glycols, such as ethylene glycol, propylene glycol, neopentyl glycol, butylene glycol, 1,4-butanediol, hexylene glycol, 1,6-hexanediol, the polyglycols, such as diethylene glycol or triethylene glycol, etc.; the triols such as glycerine, trimethylol ethane, trimethylol propane, etc., and other higher functional alcohols such as pentaerythritol, sorbitol, mannitol, and the like. Acids useful in preparing the alkyd resins of this invention include monofunctional acids, such as rosin acids, benzoic acid, paratertiary butyl benzoic acid and the like; the polyfunctional acids, such as adipic acid, azelaic acid, sebacic acid, phthalic acid or anhydride, isophthalic acid, terephthalic acid, dimerized and polymerized fatty acids, trimellitic acid, and the like.

The preferred alkyd resins are prepared by reacting a triol, such as trimethylol propane with aliphatic dibasic acids, such as adipic acid, and an aromatic dibasic acid, such as phthalic anhydride, in the presence of a fatty acid, such as hydrogenated castor oil fatty acid. The preferred molar ratios of triol to aliphatic di-acids to aromatic di-acids to fatty acids are in the ranges of 1.5:2.5 to 7:10 to 0.5:1.5 to 0.25:1. The preferred reactants are selected from trimethylolpropane, adipic acid, phthalic anhydride or isophthalic acid, and hydrogenated castor oil fatty acid.

In order to prepare materials having pendant carboxy groups, an excess of carboxylic acid equivalents over hydroxy equivalents is employed.

The principal difference between the alkyd resins and the so-called "oil-less" alkyds or polyester resins is that the "oil-less" alkyds contain little or no fatty acid-containing materials. Other than this, the previously mentioned requirements for acid number, hydroxyl number and other requirements of the alkyd resins are equally applicable to the "oil-less" polyester resins.

A particularly preferred polyester resin is prepared by reacting a long-chain glycol, a glycol, isophthalic acid, an aromatic dicarboxylic acid and an aliphatic dicarboxylic acid in molar ratios of about 1 mole of long-chain glycol, two moles of glycol, one mole of aromatic di-acid, and one mole of aliphatic diacid.

Preferred long chain glycols include the polyalkylene glycols, such as triethylene glycol; shortchain glycols include ethylene glycol and 1,3-butylene glycol. The aromatic di-carboxylic acids include phthalic or isophthalic acids; while the aliphatic di-acids include azelaic, adipic and sebasic acids.

Other types of polymeric materials which may be utilized to furnish either the carboxyl or hydroxy-containing polymer are the so-called epoxy resins and more particularly, the epoxy resin esters. The epoxy resins are basically polyglycidyl ethers of polyhydric phenols obtained by reacting a polyhydric phenol in excess epihalohydrin with sodium hydroxide. Examples of the polyhydride phenols include bisphenol A (p,p'-dihydroxy diphenylpropane), resorcinol, hydroquinone, 4,4'-dihydroxy benzophenone, bis(4-hydroxyphenyl)ethane, 1,5-dihydroxy naphthalene 4,4'-dihydroxybiphenyl, and the like.

Other glycidyl ethers of polyhydric phenols are polymers prepared by reacting 1.1 up to about 2 moles of epichlorohydrin with 1 mole of dihydric phenol or by reacting polyepoxides with added polyhydric phenol.

Additional epoxide resins are glycidyl ethers of polyhydric alcohols, prepared by reacting a polyhydric alcohol in epichlorohydrin with an acid catalyst, such as boron trifluoride, and subsequently reacting the resulting product with an alkaline dehydrohalogenating agent. Included among the polyhydric alcohols which can be used in the preparation of these polyepoxides are ethylene glycol, pentaerythritol, propylene glycol, diethylene glycol, hexanediol, trimethylol ethane, trimethylol propane, and the like.

The polyepoxides after they have been prepared as described above are then reacted with either a carboxylic acid, an alcohol, or added monohydric phenol, in order to completely react all of the free epoxide groups. Where acid-functional materials are desired, any of the previously polycarboxylic acids may be reacted with the polyepoxide to yield an acid-functional material having an acid value and molecular weight as previously described. Instead of utilizing a carboxylic acid for reaction with the polyepoxide, a polyfunctional alcohol may be reacted with the polyepoxide in the same manner as preparing a hydroxy-containing material. In addition, however, monocarboxylic acids or mono-alcohols may be reacted with the polyepoxide to produce materials having pendant hydroxy groups. Thus, for example, so-called epoxy ester materials may be utilized, where, for example, a fatty acid has been reacted with a polyepoxide yielding at least about two pendant hydroxy groups per molecule.

Yet another type of polymer useful herein is prepared by reacting an epoxide-containing monomer as described above, e.g., propylene oxide or ethylene oxide, with a polyol containing at least three hydroxyl groups per molecule. Examples of said polyols include glycerine, pentaerythritol, the polymers of pentaerythritol, trimethylolpropane, trimethylolethane, and the like.

Another method of obtaining carboxylic acid-containing polymers, is by reacting an hydroxy-containing polymer with a carboxylic acid anhydride, such as phthalic anhydride, trimellitic anhydride, succinic anhydride, and the like. Thus, the anhydride is simply mixed into the desired polymer and the polymer heated to just above the melting point of the anhydride. The anhydride ring is then opened by co-reaction between the pendant hydroxy groups and the anhydride, and there results a half-ester reaction, producing a polymer having pendant carboxylic acid groups.

As previously stated a polymer of the moiety C-X is reacted with a monomer of the formula

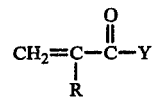

wherein X is OH when Y is OH, and X is COOH when Y is R'OH wherein R is hydrogen or methyl, and R' is $C_1$-$C_6$ alkyl.

Thus, where pendant hydroxy-containing polymers are utilized, acrylic or methacrylic acids are employed, and where pendant carboxy-containing materials are utilized, hydroxy alkyl esters of acrylic or methacrylic acids are employed. In any event, at least two and preferably three of the acrylate or methacrylate monomers are reacted onto each polymer molecule.

This reaction may be catalyzed using any type of acid catalysis, including toluene sulfonic acid, benzene sulfonic acid, or any of the other acid-containing catalysts. A particularly preferred catalyst is an essentially solid, ion exchange resin as further described in Kirk-Othmer *Encyclopedia of Chemical Technology*, 2nd Ed., Vol. II. The term "essentially solid" means a material which is crushable or pulverizable, and is non-sintering in that form. The ion exchange resin must further be insoluble in the reaction medium, must be of the acidic cationic exchange type, and must comprise a polymer matrix onto which has been grafted sulfonic or phosphoric acid groups. In most instances, a predominantly aromatic polymer is formed utilizing vinyl aromatic monomers, such as styrene or vinyl toluene, and a polyfunctional monomer, such as, for example, divinyl benzene. The resulting polymer is then sulfonated or phosphorated to produce pendant phosphoric acid or sulfonic acid groups, as the case may be. Preferably, the ion exchange resins of the instant invention are prepared by sulfonating an aromatic vinyl polymer or copolymer with a sulfonating agent selected from sulfuric acid, chlorosulfonic acid or sulfur trioxide.

The preferred ion exchange resins have hydrogen ion concentrations from their sulfonic or phosphoric acid groups in the range of about one to about ten milliequivalents of hydrogen ion per gram of dry material. An alternate method for preparing these ion exchange resins is by homo- or co-polymerizing with other monomers a material such as styrene sulfonic acid.

Preferably, the ion exchange resin is utilized in its bead form, i.e., as particulate spheres having a majority of particles which will pass through at least 16-20 mesh U.S. Standard Screens, preferably 20-30 mesh.

Crushed or pulverized versions of the resin may also be utilized.

In order to prepare the novel products of this invention, the co-reactants, i.e., the polymer and the carboxy or hydroxy-containing monomer, are mixed in a reaction flask along with the desired catalyst. Where a soluble acidic catalyst is used, generally it will be added between 0.25 and 10 percent, based on the weight of the reactants. Where an ion exchange resin is utilized, it is employed at about the 5 to 50 percent level, by weight, based upon the total amount of the reactants, preferably about 10 to about 30 percent.

In order to remove the water of reaction a partially solubilized hydrocarbon fraction azeotrope solvent is utilized. This solvent should contain, by weight, up to about 15 percent of aromatic material, about 40 to about 80 percent of saturated aliphatic materials, and about 20 to about 50 percent, by weight, of cyclic aliphatic materials. The preferred limits are respectively about 2 to about 12 percent, about 50 to about 60 percent, and about 25 to about 40 percent. The azeotrope solvent should exhibit a maximum solvent reflux temperature of about 98°C., preferably about 96° C. Materials falling within this range include Lactol Spirits, available from Amsco Division of Union Oil Corporation. The amount of the reflux solvent will depend upon the vinyl component, the polymer type, etc., but can range from about 1 to about 25 percent, by weight, or more, based upon the reactant weight.

While it is preferred to utilize an azeotrope solvent throughout the entire course of the reaction, where the initial water of reaction may be removed below about 150° C., during the period when the temperature does not exceed 150° C. and the water is being removed, no azeotrope solvent is necessary. However, when the water of reaction ceases to evolve, and the temperature has reached about 150° C., the azeotrope solvent should be added. The azeotrope solvent will have the effect of reducing the reaction temperature to the temperature previously referred to, generally below about 100° C.

Also added to the reaction mixture is a polymerization inhibitor to insure that homopolymerization of the alpha beta ethylenically unsaturated vinyl polymerizable monomer does not occur during esterification. Examples of such materials include the quinones, such as hydroquinone, the various phenols, p-tert-butylcatechol, p-methoxyphenol, 2,4-dichloro-6-nitrophenol, n-propyl gallate, di-tert-butyl-p-cresol, 2,2'-methylene bis(4-methyl-6-tert-butylphenol), 1-amino-7-naphthol, p-benzoquinone, 2,6-dichloro-p-benzoquinone, 2-amino-1,4-naphthoquinone, 3-aminoanthraquinone, diphenylamine, p-nitrosodimethylaniline, α and β -naphthylamine, phenothiazine, N-nitrosodimethylamine, hexamethylphosphoramide, n-dedecyl mercaptan, benzenethiol, 2,2-diphenyl-1-picrylhydrazyl (phenyl hydrazine), divinylacetylene, and various antimony and copper salts. The inhibitors should be added to the reaction mixture in the range of about 50–1000 parts per million parts by weight of reactant, preferably about 100–400 ppm.

During the reaction and the subsequent vacuum strip of the azeotrope solvent, a steady stream of oxygen-containing nitrogen, i.e., nitrogen containing about 2–25 percent, by volume, of oxygen, should be sparged into the reactor in order to keep the inhibitor active.

When the theoretical water has been removed, or when an acid value near zero is obtained, reaction is stopped and the azeotrope solvent is removed.

One of the most unique features of the instant invention is the discovery that the hydrocarbon fraction utilized herein is insoluble in the reaction medium after the reaction is complete. As the reaction mixture cools, a phase separation occurs allowing the removal of about half of the partially solubilized hydrocarbon fraction by decantation. Following this operation the application of a vacuum and low temperatures (up to about 150° C.) are employed to remove the remainder of the solvent. Where an ion exchange resin is utilized, the reaction medium is filtered ad the ion exchange resin removed for repeated use.

The pendant vinyl group-containing polymer as prepared above, may be compounded into ultraviolet curable coating compositions as described hereafter.

Generally, the ultraviolet curable compositions of the instant invention contain from about 40 to about 100 percent, by weight, based on the total curable composition, of an alpha beta ethylenically unsaturated vinyl polymerizable compound containing at least two vinyl polymerizable groups per molecule. Included are unsaturated esters of polyols and particularly such esters of the alpha methylene carboxylic acids, e.g., ethylene diacrylate, diethylene glycol diacrylate, glycerol diacrylate, glycerol triacrylate, ethylene dimethacrylate, 1.3-propanediol dimethacrylate, 1,2,4-butanetriol trimethacrylate, 1,4-cyclohexanediol diacrylate, 1,4-benzenediol dimethacrylate, pentaerythritol tri- and tetraacrylate and methacrylate, trimethylolpropane triacrylate, trimethylolethane triacrylate, dipentaerythritol hexacrylate, tripentaerythritol octa-acrylate, sorbitol hexacrylate, 1,3-propanediol diacrylate, 1,5-pentanediol dimethacrylate, hexanediol diacrylates, the bis-acrylates and methacrylates of polyethylene glycols of a molecular weight of 200–1500, and the like; unsaturated amides, particularly those of the alpha methylene carboxylic acids, especially those of alpha, omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine tris-methacrylamide, bis(gammamethacrylamidopropoxy)ethane, beta-methacrylamidoethyl methacrylate, N-beta-hydroxyethyl-beta(methacrylamido)ethyl acrylate, and N,N-bis(betamethacryloxyethyl) acrylamide; vinyl esters such as divinyl succinate, divinyl adipate, divinyl phthalate, divinyl terephthalate, divinyl benzene-1,3-disulfonate, and divinyl benzene-1,4-disulfonate; styrene and derivatives thereof and unsaturated aldehydes, such as sorbaldehyde (hexadienal). An outstanding class of these preferred addition polymerizable components are the esters and amides of alphamethylene carboxylic acids and substituted carboxylic acids with polyols and polyamides wherein the molecular chain between the hydroxyl and amino groups is solely carbon or oxygen-interrupted carbon.

The polyethylenic unsaturation-containing polymer, as prepared by the instant invention, can be present in an amount from about 40 to about 100 percent, by weight, based on the total curable composition. In other words, it may be the only ethylenically unsaturated vinyl polymerizable compound present containing at least two vinyl polymerizable groups per molecule, or it may be used in combination with other such materials. Other types of polymers containing ethylenic unsaturation which may be utilized herein include polymers containing maleic and fumaric acids or esters, as well as polymeric unsaturated materials prepared by reacting vinyl hydroxy or carboxy materials with polyepoxides, e.g., acrylic acid with the diglycidyl ether of bisphenol A. Also included are polymers such as polyvinyl acetate/acrylate, cellulose acetate/acrylate, cellulose acetate/methacrylate, N-acryloxymethylpolyamide, N-methacryloxymethylpolyamide, allyloxymethylpolyamide, etc.

In addition to the aforementioned polyfunctional polymerizable compounds, compounds containing a single polymerizable ethylenically unsaturated group of the structure

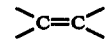

can also be utilized. In addition to traditional monomers, as described hereafter, the mono-unsaturated compounds may be polymeric materials, as previously described, containing on the average a single site of unsaturation on each polymer molecule. These monomers can be aliphatic, aromatic, cycloaliphatic or any variant thereof. Among the monomers are included styrene, 4-methylstyrene, alphamethylstyrene, and the like; acrylic acid and its nitrile, amide and $C_1$-$C_{12}$ alkyl, aryl, or hydroxy alkyl derivatives, such as acrylonitrile, ethylacrylate, 2-ethylhexyl acrylate, butoxyethoxyethyl acrylate, hydroxyethyl acrylate, as well as others; the vinyl halides, such as vinyl chloride, vinylidene chloride, and the like; vinyl ketones, such as vinyl phenyl ketone, vinyl methyl ketone, alpha-chlorovinyl methyl ketone, and the like; the vinyl thioethers such as vinyl ethyl sulfide, vinyl p-tolylsulfide, divinyl sulfide, and the like. Other monomers include vinyl ethyl sulfone, vinyl ethyl sulfoxide, vinyl sulfonic acid, sodium vinyl sulfonate, vinyl sulfonamide, vinyl pyridine, N-vinyl pyrrolidone, N-vinyl carbazole, and the like. Generally any alpha beta ethylenically unsaturated monomer which does not interfere with the ultraviolet curing mechanism may be utilized, and as such, these monomers are well known in the art.

These compounds may be added in amounts up to about 60 percent, by weight, based upon the total curable composition, preferably about 10 to about 30 percent.

The instant invention can also contain up to about 60 percent, by weight, based upon the total curable system, of a polymeric material containing no polymerizable unsaturation. Among the polymers are the polyolefins and modified polyolefins, the vinyl polymers, the polyethers, the polyesters, the polylactones, the polyamides, the polyurethanes, the polyureas, the polysiloxanes, the polysulfides, the polysulfones, the polyformaldehydes, the phenol-formaldehyde polymers, the natural and modified natural polymers, the heterocyclic polymers, and the like.

Illustrative of these polymers are the acrylic polymers such as poly(acrylic acid), poly(methyl acrylate), poly(ethyl acrylate), poly(methacrylic acid), poly(methyl methacrylate), poly(ethyl methacrylate); poly(vinyl chloride); poly(vinyl alcohol); poly(ethylene/propylene/5-ethylidenebicyclo[2.2.1]-hept-2-ene); polyethylene; polypropylene; synthetic rubbers, e.g., butadieneacrylonitrile copolymers and chloro-2-butadiene 1,3-polymers; the polyesters, copolyesters, polyamides and copolyamides, such as polycaprolactone, poly(caprolactone/vinyl chloride, poly(ethylene glycol terephthalate), poly(hexamethylene succinate), poly(hexamethylene maleate), poly(hexamethylene carbonate), poly(caprolactam), poly(hexamethylene adipamide), and the like; the polyethers such as poly(glutaraldehyde), polyethylene oxide, polypropylene oxide, poly(tetrahydrofuran) polycyclohexene oxide, copolymers of ethylene oxide and propylene oxide with starters containing reactive hydrogen atoms such as the mixed copolymers using ethylene glycol, glycerol, sucrose, etc., as the starter; vinylidene polymers and copolymers, e.g., vinylidene chloride/acrylonitrile, vinylidene chloride/methacrylate and vinylidene chloride/vinyl acetate polymers; ethylene/vinyl acetate copolymers; the polyureas and polyurethanes, such as described in *Polyurethanes Chemistry and Technology*, Volumes I and II, Sanders and Frisch, published by Interscience Publishers; the polycarbonates; polystyrenes; polyvinyl acetals, e.g., polyvinyl butyral, polyvinyl formal; the cellulose ethers, e.g., methyl cellulose, ethyl cellulose, and benzyl cellulose; the cellulose esters, e.g., cellulose acetate, cellulose acetate succinate and cellulose acetate butyrate; as well as the natural and modified natural polymers such as gutta sercha, cellulose, gelatin, starch, silk, wool, and the like; the siloxane polymers and copolymers; the formaldehyde polymers such as polyformaldehyde; formaldehyde resins such as phenol-formaldehyde, melamine-formaldehyde, urea-formaldehyde, aniline-formaldehyde and acetone-formaldehyde; phenolic resins and the like.

If desired, the photo-polymerization compounds can also contain immiscible polymeric or non-polymeric organic or inorganic fillers or reinforcing agents, e.g., the organophilic silicas, bentonites, silica, powdered glass, colloidal carbon, as well as various types of dyes and pigments, in varying amounts. The fillers are useful in improving the strength, reducing tack and as coloring agents in the coatings of this invention.

In order to insure that the compositions of the instant invention are curable when exposed to ultraviolet or electromagnetic radiation, a photosensitizer is employed in an amount of from about 0.1 up to about 15 percent, by weight, based on the total curable composition, preferably about one to about five percent, by weight, on the same basis.

These photosensitizers fall into many classes and include compounds such as benzoin derivatives, as disclosed in German Patent No. F523401VC/396, acetophenone, propiophenone, xanthone, fluorenone, benzaldehyde, fluorene, anthraquinone, triphenylamine, carbazole, 3- or 4-methylacetophenone, 3- or 4-pentylacetophenone, 3- or 4-methoxyacetophenone, 3- or 4-bromoacetophenone, 3- or 4-allylacetophenone, p-diacetylbenzene, 3- or 4-methoxybenzophenone, 3- or 4-methylbenzophenone, 3- or 4-chlorobenzophenone, 4,4'-dimethoxybenzophenone, 4-chloro-4'-benzylbenzophenone, 3-chloroxanthone, 3,9-dichloroxanthone, thioxanthone, and chlorinated thioxanthones, 3-chloro-8-nonylxanthone, 3,-methoxyxanthone, 3-iodo-7-methoxyxanthone, and the like.

Also included are the acetophenone photosensitizers of the type described in U.S. Patent No. 3,715,293, having the structure

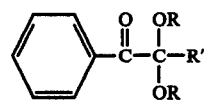

I.

wherein R is alkyl of from 1–8 carbon atoms, or aryl with 6 carbon atoms, and R' is hydrogen, alkyl of from 1–8 carbon atoms, aryl of from 6–14 carbon atoms or cycloalkyl of 5–8 carbon atoms.

The alkylphenone photosensitizers having the formula

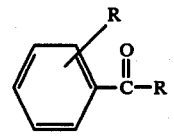

II.

the benzophenone type photosensitizers having the formula

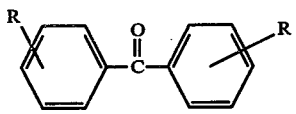

the tricyclic fused ring type having the formula

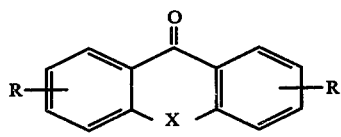

and the pyridyl type having the formula

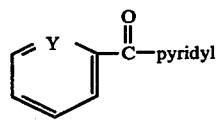

wherein the various substituents are as further described in U.S. Patent No. 3,759,807, are also included.

Other photosensitizers include 1- and 2-chloroanthraquinone 2- methylanthraquinone, 2-tertiary butyl anthraquinone octamethylanthraquinone, 1-4-napthoquinone, 9-10-phenanthrenequinone, 1,2-benzanthraquinone, 2-3-benzanthraquinone, 2-methyl-1,4-naphthoquinone, 2-3-dichloronaphthoquinone, 1-4-dimethylanthraquinone, 2-3-dimethylanthraquinone, 2-phenylanthraquinone, 2-3-diphenylanthraquinone, sodium salts of anthraquinone alpha-sulfonic acid, 3-chloro-2-methylanthraquinone, and the like. Other photoinitiators which are also useful are described in U.S. Patent No. 2,760,863 and include vicinal ketaldonyl compounds, such as diacetyl benzyl, etc., alpha ketaldonyl alcohols, such as benzoin, pivaloin, etc., acyloin ethers, e.g., benzoin methyl and ethyl ethers, etc., alpha hydrocarbon substituted aromatic acyloins, including alphamethyl benzoin, alphaallyl benzoin, and alpha phenyl benzoin. Also included are the diacylhalomethanes, corresponding to one of the general formulas:

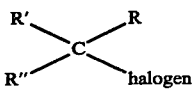

and

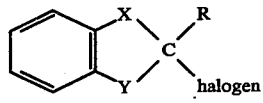

wherein halogen represents a halogen atom such as chlorine or bromine; R represents a hydrogen atom, a chlorine or bromine atom, or an acetyloxy group; R' and R" (same or different) represent a benzoyl group, a nitrobenzoyl group, a dimethylamino benzoyl group, a phenyl sulfonyl group, a carboxy phenyl sulfonyl group, a methylphenyl sulfonyl group, or a naphthoyl group; and X and Y (same or different) represent a carbonyl group or a sulfonyl group. Included are 2-bromo-1,3-diphenyl-1,3-propane dione; 2,2-dibromo-1,3-indane dione; 2,2-dibromo-1,3-diphenyl-1,3-propane dione 2-bromo-2-(phenylsulfonyl acetal phenone) and the like, as further described in U.S. Patent No. 3,615,455.

Other photoinitiators are cataloged by G. Delzenne in *Industrie Cimique Belge*, 24 (1959), 739-764. Most preferred among the added initiators are benzoin and its alkyl ethers, benzophenone and its derivatives, as in Formula III, xanthone, thioxanthones and chlorinated thioxanthones, acetophenone derivatives, as set out in Formula I, and halogenated, aliphatic and aromatic polychlorinated biphenyls and polyphenyls.

Although not always required, certain organic amines can be added to the photosensitizers above-described to further enhance the cure rate of the compositions of the instant invention in amounts up to about 500 percent, by weight, of the photosensitizer, preferably up to about 50 percent, by weight. The amines can be primary, secondary, or tertiary, and can be represented by the general formula:

wherein R' and R" taken singly can be hydrogen, linear or branched alkyl having from 1 to about 12 carbon atoms, linear or branched alkenyl having from 2 to about 12 carbon atoms cycloalkyl having from 3 to about 10 ring carbon atoms, cycloalkenyl having from 3 to about 10 ring carbon atoms, aryl having from 6 to about 12 ring carbon atoms alkaryl having 6 to about 12 ring carbon atoms; R''' has the same meaning as R' and R" with the exception that it cannot be hydrogen and that it cannot be aryl when both R' and R" are aryl. When taken together R" and R''' can be a divalent alkylene group $-(C_nH_{2n})-$ having from 2 to about 12 carbon atoms, a divalent alkenylene group $-(C_nH_{2n-1})-$ having from 3 to about 10 carbon atoms, a divalent alkadienyleno group $-(C_nH_{2n-2})-$ having from 5 to about 10 carbon atoms, a divalent alkatrienylene group $-(C_nH_{2n-3})-$ having from 5 to about 10 carbon atoms, a divalent alkyeneoxyalkylene group $-(C_xH_{2x}OC_xH_{2x})-$ having a total of from 4 to about 12 carbon atoms, or a divalent alkyleneaminoalkylene group

having a total of from 4 to about 12 carbon atoms. As previously indicated, the amines can be substituted with other groups; thus, the R', R" and R''' variables, whether taken singly or together, can contain one or more substituents thereon. The nature of such substituents is generally not of significant importance and any substituent group can be present that does not exert a pronounced deterrent effect on the ultraviolet cross-linking reaction.

Illustrative of suitable organic amines one can mention are methylamine, dimethylamine, trimethylamine, diethylamine, triethylamine, propylamine, isopropylamine, diisopropylamine, triisopropylamine, butylamine, tributylanine, t-butylamine, 2-methylbutylamine, N-methyl-N-butylamine, di-2-methylbutylamine, trihexylamine, tri-2-ethylhexylamine, dodecylamine, tridodecylamine, tri-2-chloroethylamine, di-2-bromoethylamine, methanolamine, ethanolamine, diethanolamine, triethanolamine, methyldiethanolamine, dimethylethanolamine, isopropanolamine, propanolamine, diisopropanolamine, triisopropanolamine, butylethanolamine, dihexanolamine, 2-methoxyethylamine, di2-ethylhexlamine, tri2-ethoxyethylamine 2-hydroxyethyldiisopropylamine,2-aminoethylethanolamine, allylamine, butenylamine, dihexadienylamine, cyclohexylamine, tricyclohexylamine, trimethylcyclohexylamine, bis-methylcyclopentylamine, tricyclohexenylamine, tricyclohexadienylamine, tricyclopentadienylamine, N-methyl-N-cyclohexylamine N-2-ethylhexyl-N-cyclohexylamine, diphenylamine, phenyldimethylamine, methylphenylamine, ditolylamine, trixylyl-amine, tribenzylamine, triphenethylamine, benzyldimethylamine, benzyldihexylamine, tris-chlorophenethylenimine, N-methylethylenimine, N-cyclohexylethylenimine, piperidine N-ethylpiperidine, 2-methylpiperidine, 1,2,3,4-tetrahydropyridine, 1,2-dihydropyridine, 2-, 3- and 4-picoline, morpholine, N-methyl morpholine, N-2-hydroxyethylmorpholine, N-2- ethoxyethylmorpholine, piperazine, N-methylpiperazine, N,N''-dimethylpiperazine 2,2-dimethyl-1,3-bis[3(N-norpholinyl)-propionyloxy]propane, 1,5-bis[3-(N-morpholinyl)-propionyloxy]diethyl ether, and the like. The preferred organic amines are the tertiary amines, with the alkanol amines being most preferred. The specific preferred amine activators are triethanolamine, morpholine and methyldiethanolamine.

The compositions of the instant invention after being prepared in the ratios as set out above can be applied to the material to be coated by conventional means, including brushing, spraying, dipping, curtain and roll coating techniques, and may, if desired, be dried under ambient or oven conditions to provide coating films on the substrate. The substrate can be of any composition, e.g., wood, metal, paper, plastic, fabric, fiber, ceramic, concrete, plaster, glass, etc.

Typically a mixture of the compositions described above in combination with the photoinitiators and, where utilized, the amine activator, is prepared and the composition applied to the desired wood substrate. It is then exposed to electromagnetic radiation having wave lengths of above about 2000 Angstrom units, preferably from about 2000 up to about 5000 Angstroms. Exposure should be from a source located about 1 to 5 inches from the coating for a time sufficient to cause crosslinking of the composition and can range from about 0.1 seconds up to about 1 min./linear ft. Generally the light radiation will have power of about 200 watts per linear inch.

The light radiation can be ultraviolet light generated from low, medium and high pressure mercury lamps. This equipment is readily available and its use is well known to those skilled in the art of radiation chemistry.

The compositions of the instant invention produce coatings which, when cured, are less prone to yellow upon exposure to light, and have good gloss and adhesion properties. The coatings are particularly useful in metal decorating applications.

In the following examples all parts and percentages are by weight unless otherwise indicated.

EXAMPLE 1

Into a reactor equipped with a mechanical agitator, reflux condenser and distillation take-off arm, were added 337.7 parts of trimethylolpropane, 757.0 parts of triethylene glycol, 297.9 parts of 1,6-hexanediol, 11.08 parts of adipic acid and 1.8 parts of dibutyl tin oxide. After heating under nitrogen at temperatures ranging from about 145°–220° C. over about nine and one-half hours, a product resulted having an acid value of 1.6 and an hydroxyl number of 186.36. 275 parts of water were removed.

511.7 parts of the above polyester resin were mixed with 122.5 parts of acrylic acid, 3.0 parts of methane sulfonic acid, 0.045 parts of phenothiazine, 0.015 parts of nitrobenzene and 120.7 parts of lactol spirits available from the Amsco Chemical Company in the reactor above. Lactol spirits contains 10.2 percent aromatics, 56.0 percent saturated aliphatics, and 33.7 percent cyclic aliphatics and has a maximum reflux temperature of 95° C. The materials were heated to about 95° C. over about half an hour and reflux at this temperature was continued for about ten and one-half hours, at which point 28 parts of water had been removed. The azeotroping solvent was removed by gradually reducing the pressure in the reactor to 0.5 mm/Hg while slowly heating the reaction mass to a temperature of 65° C. over about three hours. The resulting product had an acid value of 23.6.

EXAMPLES 2–6

The above example was repeated with various solvents used in place of lactol spirits. Percent conversion was determined by measuring the condensate removal of the system. In Examples 2, 3 and 4, a stoichiometric ratio of polyester to acrylic acid was employed, while in Examples 5 and 6 a ratio of 1.25 equivalents of acrylic acid for each hydroxyl equivalent of polyester was employed, with the following results:

| Solvent System | Maximum Reaction Temp., °C | % Conversion at Hours of Reaction | | | | |
|---|---|---|---|---|---|---|
| | | 2 Hrs. | 4 Hrs. | 6 Hrs. | 8 Hrs. | 10 Hrs. |
| Benzene | 100 | 32.6 | 55.6 | 66.7 | 79.6 | 85.2 |
| Benzene/ 1,1 Dichloroethane | 101 | 33.3 | 51.9 | 63.0 | 74.1 | 81.5 |
| Benzene/ 1,2 Dichloroethane | 101 | 29.6 | 51.9 | 63.0 | 75.9 | 85.2 |
| Toluene/Lactol Spirits | 108 | 28.5 | 50.7 | 61.8 | 74.5 | 82.4 |
| Lactol Spirits | 95 | 35.9 | 62.1 | 75.1 | 81.7 | 88.2 |

As can be seen from the above examples, when lactol spirits are utilized, significant improvements in processing times are noted.

What is claimed is:

1. A process for preparing an ultraviolet curable polymer having pendant acrylate or methacrylate groups which comprises co-reacting in the presence of a vinyl polymerization inhibitor and a nitrogen-oxygen sparge a polymer containing the C-OOH moiety with a monomer having the general formula

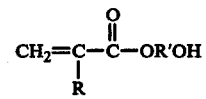

wherein R is hydrogen or methyl, and R' is $C_1$-$C_6$ alkyl, utilizing a partially solubilized hydrocarbon fraction as an azeotroping solvent, wherein said solvent contains up to about 15 percent, by weight, aromatics, about 40 to about 80 percent, by weight, saturated aliphatics, and about 20 to about 50 percent, by weight, cyclic aliphatics.

2. The process of claim 1 wherein the starting polymer has a molecular weight of less than about 10,000, and contains at least about two carboxy groups per molecule.

3. The process of claim 1 wherein the partially soluble hydrocarbon fraction is comprised of about 2 to about 12 percent, by weight, of aromatics, about 50 to about 60 percent, by weight, of saturated aliphatics, and about 25 to about 40 percent, by weight, of cyclic aliphatics.

4. The process of claim 1 wherein the reaction is carried out in the presence of a polymerization inhibitor at about the 50–1000 parts per million of reactant level.

5. The process of claim 1 wherein the nitrogen-containing oxygen sparge contains from about 2 to about 25 percent, by volume, of oxygen.

6. The process of claim 1 wherein the polymer is prepared by copolymerizing alpha beta ethylenically unsaturated vinyl polymerizable monomers containing carboxy groups.

7. The process of claim 1 wherein the polymer is prepared by reacting a fatty acid with a mixture of polyols and polybasic acids.

8. The process of claim 1 wherein the polymer is prepared by the alcoholysis of a fatty oil and the further condensation of this product with polyols and polybasic acids.

9. The process of claim 1 wherein the polymeric material is an epoxy resin ester.